United States Patent
Takauchi et al.

(10) Patent No.: US 6,870,423 B2
(45) Date of Patent: Mar. 22, 2005

(54) OUTPUT CIRCUIT CAPABLE OF TRANSMITTING SIGNAL WITH OPTIMAL AMPLITUDE AND OPTIMAL COMMON-MODE VOLTAGE AT RECEIVER CIRCUIT

(75) Inventors: Hideki Takauchi, Kawasaki (JP); Tomokazu Higuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/405,241

(22) Filed: Apr. 3, 2003

(65) Prior Publication Data

US 2003/0201799 A1 Oct. 30, 2003

(30) Foreign Application Priority Data

Apr. 26, 2002 (JP) ........................................ 2002-126239

(51) Int. Cl.[7] .......................... H03F 3/45; H03K 19/094
(52) U.S. Cl. ........................ 330/253; 330/258; 326/127; 326/115
(58) Field of Search ................................ 326/115, 126, 326/127, 86; 330/253, 258; 327/108, 77, 89, 65

(56) References Cited

U.S. PATENT DOCUMENTS

| 5,831,541 A | * | 11/1998 | Paulson et al. | 340/684 |
| 5,942,921 A | * | 8/1999 | Talaga, Jr. | 327/77 |
| 6,107,882 A | * | 8/2000 | Gabara et al. | 330/253 |
| 6,611,155 B2 | * | 8/2003 | Sterrantino | 326/86 |

* cited by examiner

*Primary Examiner*—Vibol Tan
(74) *Attorney, Agent, or Firm*—Arent Fox, PLLC.

(57) ABSTRACT

An output circuit has a data control circuit, a variable resistance circuit, a common-mode voltage detection circuit, an adjusting circuit. The data control circuit controls data included in an output signal according to an input signal, the variable resistance circuit is connected in series with the data control circuit between a first power supply line and a second power supply line. Further, the common-mode voltage detection circuit detects a common-mode voltage of the output signal, and the adjusting circuit adjusts a resistance of the variable resistance circuit according to an output of the common-mode voltage detection circuit. The common-mode voltage of the output signal is adjusted to equal an optional voltage, and an amplitude of the output signal is adjustable.

19 Claims, 7 Drawing Sheets

OUTPUT CIRCUIT CAPABLE OF TRANSMITTING SIGNAL WITH OPTIMAL AMPLITUDE AND OPTIMAL COMMON-MODE VOLTAGE AT RECEIVER CIRCUIT

CROSS REFERENCE TO RELATED APPLICATION

This application is based upon and claims the benefit of priority from the prior Japanese Patent Application No. 2002-126239, filed on Apr. 26, 2002, the entire contents of which are incorporated herein by reference.

BACKGROUND OF THE INVENTION

1. Field of the Invention

The present invention relates to an output circuit and, more particularly, to an output circuit employed in a signal transmission system, a semiconductor storage device, or the like.

2. Description of the Related Art

Recently, it has become necessary to transfer signals between circuits that are different from each other in terms of a power supply voltage and are included in large-scale integration circuits (LSI circuits) constituting an information processing system, or between circuits included in one LSI circuit. However, when signals are transferred between such circuits different from each other in terms of a power supply voltage, it has been difficult for an output circuit to transmit signals to a receiver circuit with an optimal common-mode voltage. Furthermore, in order to cope with a recent demand for high-speed transmission, the problems of a loss of a high-frequency component and reflection of a signal must be solved.

Specifically, a circuit capable of operating at a high speed so as to meet a recent request for high-speed transmission often includes, for example, transistors that can operate at a high speed but that can resist only a low voltage. Further, assuming that such a circuit is connected to a circuit that is different from the circuit in terms of, for example, a power supply voltage, a signal amplitude, or a common-mode voltage, if a voltage exceeding a voltage which the transistors can resist is applied to the circuit, the circuit may be broken.

The prior art and the problems associated with the prior art will be described in detail later with reference to accompanying drawings.

SUMMARY OF THE INVENTION

An object of the present invention is to provide an output circuit capable of transmitting a signal to a receiver circuit with an optimal amplitude and an optimal common-mode voltage. Another object of the present invention is to provide an output circuit that requires a low power consumption and that can transmit a signal of a small amplitude so as to prevent a loss of a high-frequency component and reflection of a signal.

According to the present invention, there is provided an output circuit comprising a data control circuit controlling data included in an output signal according to an input signal; a variable resistance circuit connected in series with the data control circuit between a first power supply line and a second power supply line; a common-mode voltage detection circuit detecting a common-mode voltage of the output signal; an adjusting circuit adjusting a resistance of the variable resistance circuit according to an output of the common-mode voltage detection circuit, wherein the common-mode voltage of the output signal is adjusted to equal an optional voltage, and an amplitude of the output signal is adjustable.

The adjusting circuit may comprise first devices for resisting a high voltage, and the data control circuit may comprise second devices for operating at a high speed. The variable resistance circuit may comprise the second devices. The common-mode voltage detection circuit may comprise the second devices.

The data control circuit may comprise a switching device, a control electrode of the switching device receiving the input signal, and the switching device enabling a high speed operation with a low resistive voltage. The data control circuit may comprise a diode-connected transistor for a leakage path, and the diode-connected transistor enabling a high speed operation with a low resistive voltage.

The output circuit may further comprise a current source connected between the variable resistance circuit and the data control circuit. The current source may be a transistor having a control electrode applied with a bias voltage. The adjusting circuit may be a differential amplifier differentially amplifying a reference voltage and an output of the common-mode voltage detection circuit.

The first power supply line may be a high-potential power supply line, and the second power supply line may be a low-potential power supply line. The variable resistance circuit may be a p-channel type MOS transistor, and an output of the adjusting circuit may be applied to a gate of the p-channel type MOS transistor. The data control circuit may comprise a first n-channel type MOS transistor for a switch having a gate receiving the input signal, and a diode-connected second n-channel type MOS transistor for a leakage path.

The input signal and the output signal may be single-ended signals, and the output circuit may be a single-ended type output circuit.

The input signal and the output signal may be differential signals, and the output circuit may be a differential type output circuit. The common-mode voltage detection circuit and the adjusting circuit may be provided in common to the differential signals, and the other components may be included in one-to-one association with the differential signals. The common-mode voltage detection circuit may comprise first and second resistors that are connected in series with each other and that receive the differential output signals, and the common-mode voltage of the output signals may be detected through the resistance division of the first and second resistors.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before proceeding to the detailed description of an output circuit according to the present invention, a prior art output circuit and its associated problem will be described with reference to FIG. 1.

Figure 1:
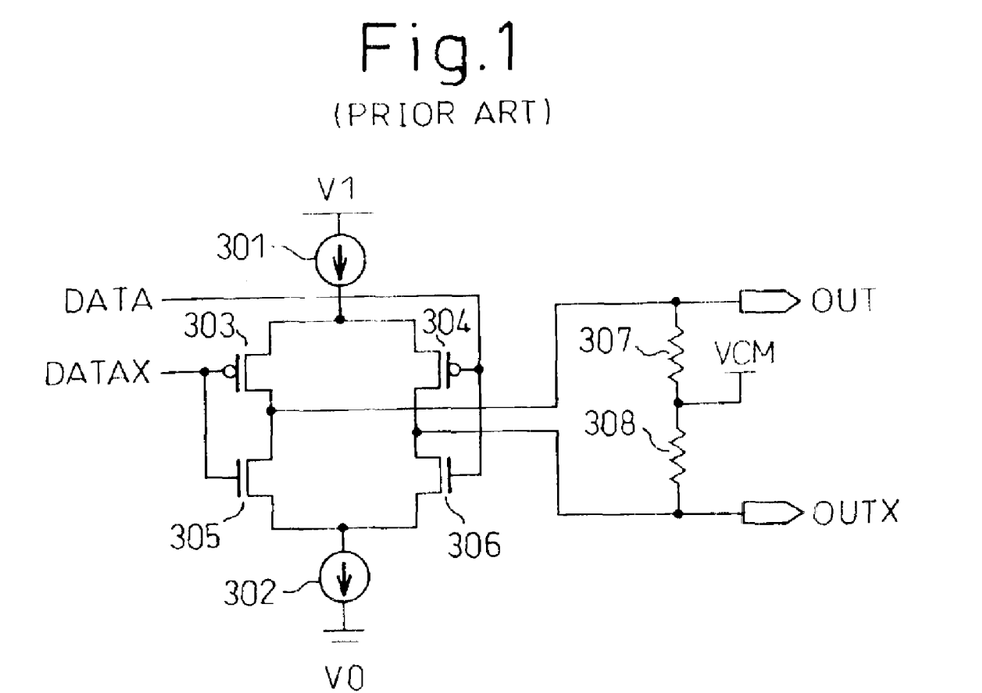
FIG. 1 is a circuit diagram showing an example of a conventional output circuit.

FIG. 1 is a circuit diagram showing an example of a conventional output circuit. Specifically, an example of an output circuit of a low-voltage differential signaling (LVDS) type serving as a small-amplitude interface is shown in FIG. 1.

As shown in FIG. 1, the example of a conventional LVDS output circuit includes current sources 301 and 302, p-channel type MOS transistors (PMOS transistors) 303 and 304, n-channel type MOS transistors (NMOS transistors) 305 and 306, and resistors 307 and 308.

Inverters (transistors 304 and 306, and other transistors 303 and 305) to which input signals DATA and DATAX are applied are provided between the current source 301 connected to a high-potential power supply line (V1) and the current source 302 connected to a low-potential power supply line (V0). Note that the input signals DATA and DATAX are differential (complementary) signals, and an output signal OUT is developed at an output terminal of the inverter (having the transistors 303 and 305) to which the input signal DATAX is applied. Further, an output signal OUTX is developed at an output terminal of the inverter (having the transistors 304 and 306) to which the input signal DATA is applied. The resistors 307 and 308 are connected in series with differential output ports OUT and OUTX respectively. A common-mode voltage VCM is applied to a node connecting the resistors 307 and 308.

In the conventional output circuit shown in FIG. 1, the amplitude of the output signals OUT and OUTX (output amplitude) can be adjusted by adjusting currents flowing out of the current sources 301 and 302 and resistances to be offered by the resistors 307 and 308. The common-mode voltage of the output signals OUT and OUTX can be adjusted by adjusting the common-mode voltage VCM to be applied to the node connecting the resistors 307 and 308.

Incidentally, a circuit capable of operating at a high speed so as to meet a recent request for high-speed transmission often includes, for example, devices (transistors) each having a gate oxide thereof thinned so that the circuit can be driven with a low power supply voltage. In other words, a circuit capable of operating at a high speed often includes transistors that can operate at a high speed but that can resist only a low voltage. For example, assume that such a circuit is connected to a circuit that is different from the circuit in terms of, for example, a power supply voltage, a signal amplitude, or a common-mode voltage. In this case, if a voltage exceeding a voltage to which the transistors are resistive is applied to the circuit, the circuit may be broken.

In order to even out a difference between dc voltages of a signal (an average voltage or a common-mode voltage), a countermeasure such as capacitive coupling has to be taken against a voltage higher than a voltage to which internal devices are resistive. Specifically, assume that a signal sent from an output circuit varies in the range from 4 V to 5 V and an input signal of a receiver circuit that receives the output signal of the output circuit ranges from 0.5 V to 1.5 V. In this case, a capacitor is provided between the output port (the output ports OUT and OUTX in FIG. 1) of the output circuit and the receiver circuit, whereby a difference between dc voltage levels of a signal is evened out.

However, for example, in the output circuit shown in FIG. 1, a common-mode voltage VCM is applied in order to regulate the common-mode voltage of the output signals (OUT and OUTX). In this case, a current flows from the power supply of the output circuit to the common-mode voltage terminal (VCM). This results in an increased current consumption. Furthermore, if a large current flows from the power supply to the common-mode voltage terminal, the common-mode voltage terminal VCM must be connected to a signal pin that exhibits a large current-carrying capacity in order to set the potential at the common-mode voltage terminal to a desired voltage.

The preferred embodiments of an output circuit according to the present invention will be described in detail below with reference to the accompanying drawings.

Figure 2:
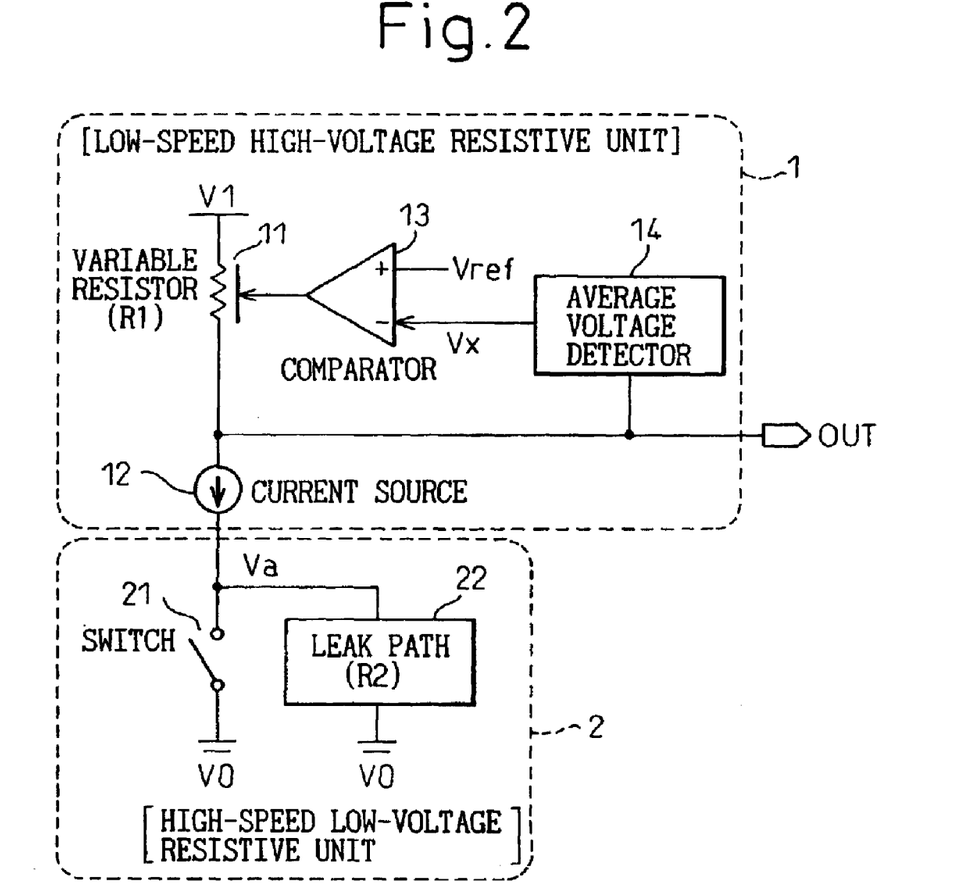
FIG. 2 is a circuit diagram showing a first embodiment of an output circuit according to the present invention.

FIG. 2 is a circuit diagram showing a first embodiment of an output circuit according to the present invention, wherein an example of a single-ended type output circuit is shown. Referring to FIG. 2, there are shown a low-speed high-voltage resistive unit 1 and a high-speed low-voltage resistive unit 2.

The low-speed high-voltage resistive unit 1 includes a variable resistor (variable resistance circuit) 11, a current source 12, a comparator (adjusting circuit) 13, and an average voltage detector (common-mode voltage detection circuit) 14. The high-speed low-voltage resistive unit 2 includes a switch 21 and a leakage path 22. Herein, the high-speed low-voltage resistive unit 2 functions as a data control circuit for controlling data included in an output signal OUT according to the input signal DATAX.

The transistors constituting the low-speed high-voltage resistive unit 1 (including the variable resistor 11, current source 12, comparator 13, and average voltage detector 14) are, for example, transistors whose gate oxides are thick and which operate at a low speed but can resist a high voltage. Further, the transistors constituting the high-speed low-voltage resistive unit 2 (including the switch 21 and leakage path 22) are, for example, transistors whose gate oxides are thin and which can resist only a low voltage but can operate at a high speed. In other words, when high-voltage resistive devices (transistors) are used to construct a circuit for determining the amplitude of the output signal OUT and the common-mode voltage thereof, the output signal OUT varying within a wide range of voltages can be transmitted.

The variable resistor 11, current source 12, and switch 21 are connected in series with one another between a high-potential power supply line (V1) and a low-potential power supply line (V0). Further, the leakage path 22 is connected in parallel to the switch 21. In other words, the current source 12 is inserted as a stage preceding the high-speed operation switch 21 for fear that a high voltage may be applied directly to one terminal (node Va) of the switch 21.

The variable resistor 11 is controlled with an output of the comparator 13. Further, the comparator 13 compares a reference voltage Vref applied to a positive input terminal thereof with an output voltage Vx of the average voltage detector 14 applied to a negative input terminal thereof. The comparator 13 then controls the resistance R1 of the variable resistor 11 so that the voltage Vx will be equal to the reference voltage Vref.

The output circuit of the first embodiment transfers a low-level or high-level output signal OUT according to whether the switch 21 is ON or OFF. Herein, the comparator 13 compares the average voltage of the output signal OUT detected by the average voltage detector 14 with the reference voltage (any voltage) Vref. Based on the result of the comparison, the resistance R1 offered by the variable resistor 11 is adjusted. In other words, when the resistance R1 of the variable resistor 11 is increased based on the reference voltage Vref, the common-mode voltage (average voltage) of the output signal OUT is lowered. In contrast, when the resistance R1 is decreased, the common-mode voltage is raised. A current flowing through the leakage path 22 is controlled, whereby the high-level voltage of the output signal to be applied with the switch 21 turned OFF can be adjusted. Further, the amplitude of the output signal OUT can be adjusted.

Figure 3A:
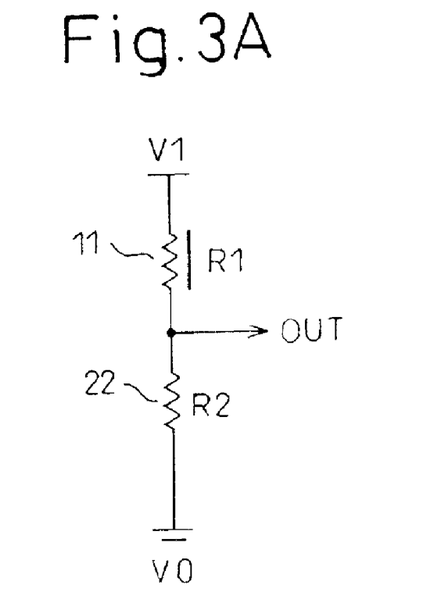
FIGS. 3A, 3B, and 3C are explanatory diagrams concerning actions to be performed in the output circuit shown in FIG. 2.
Figure 3B:
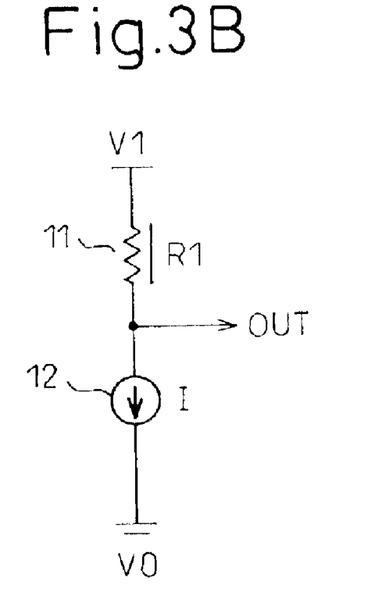
Figure 3C:
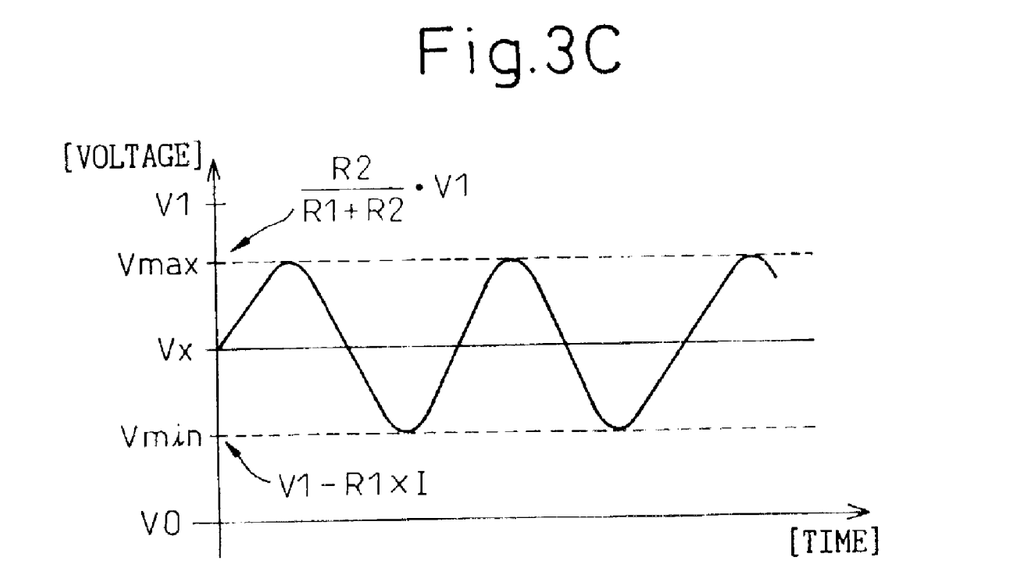

FIGS. 3A, 3B, and 3C are explanatory diagrams concerning actions to be performed by the output circuit shown in FIG. 2. FIG. 3A shows an equivalent circuit realized with the switch 21 turned OFF. FIG. 3B shows an equivalent circuit realized with the switch 21 turned ON. FIG. 3C is an explanatory diagram concerning the amplitude and common-mode voltage of the output signal OUT.

As shown in FIGS. 3A and 3C, when the switch 21 is turned OFF, the variable resistor 11 (R1) and leakage path 22 (R2) are equivalently connected in series with each other between the high-potential power supply line (V1) and low-potential power supply line (V0). The high-level voltage Vmax of the output signal OUT is provided as Vmax={R2/(R1+R2)}×V1.

On the other hand, as shown in FIGS. 3B and 3C, when the switch 21 is turned ON, the variable resistor 11 (R1) and current source 12 are equivalently connected in series with each other between the high-potential power supply line (V1) and low-potential power supply line (V0). The low-level voltage Vmin of the output signal is provided as Vmin=V1−R1×I.

Furthermore, the average voltage detector 14 detects the average voltage (common-mode voltage) Vx of the output signal OUT. The output (Vx) of the average voltage detector 14 is compared with the reference voltage Vref by the comparator 13. The resistance R1 of the variable resistor 11 is fed back. Consequently, the common-mode voltage Vx of the output signal OUT is adjusted based on the reference voltage Vref.

Figure 4:
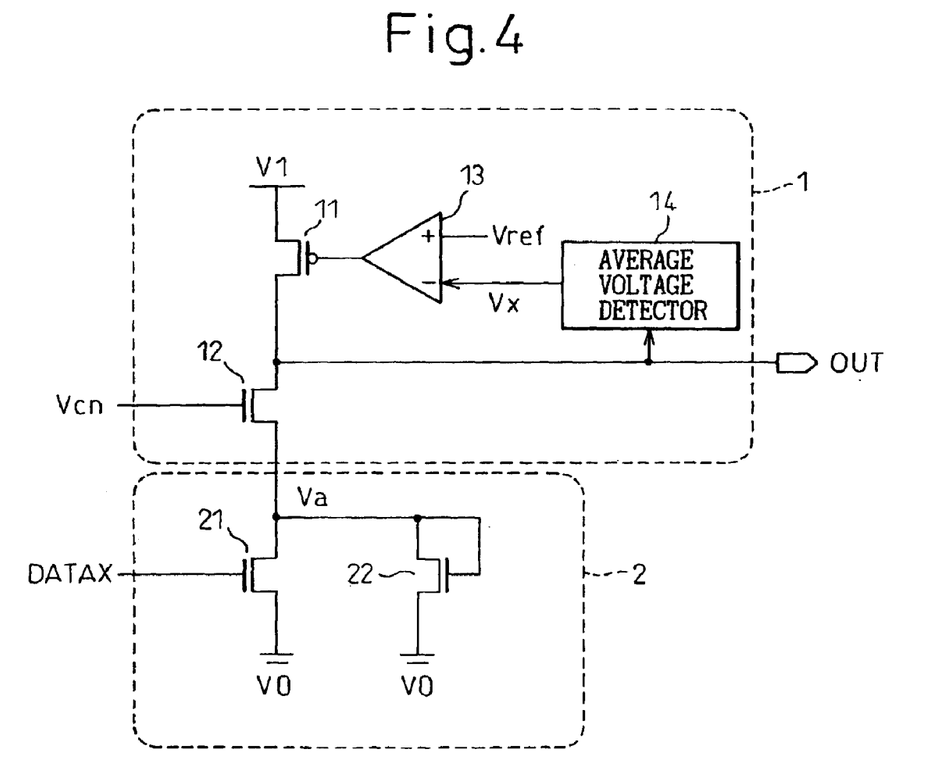
FIG. 4 is a circuit diagram showing a second embodiment of an output circuit according to the present invention.

FIG. 4 is a circuit diagram showing a second embodiment of an output circuit according to the present invention.

As apparent from comparison of FIG. 4 with FIG. 2, an output circuit of the second embodiment has the same components as the output circuit of the first embodiment does. However, the variable resistor 11 is realized with a PMOS transistor, and the current source 12, switch 21, and leakage path 22 are realized with NMOS transistors. Herein, a bias voltage Vcn is applied to the gate of the transistor 12 serving as the current source, and the input signal (of opposite level) DATAX is applied to the gate of the transistor 21 serving as the switch.

In the output circuit of the second embodiment, the drain (node Va) of the switch transistor 21 is connected to the source of the current source transistor 12. The maximum voltage Va(max) developed at the node Va is equivalent to a difference calculated by subtracting a threshold voltage Vth of the transistor 12 from the bias voltage Vcn applied to the gate of the transistor 12 (Va(max)=Vcn−Vth).

Consequently, by controlling the bias voltage vcn, the maximum voltage Va(max) at the node Va can be adjusted so that a voltage lower than a voltage to which high-speed devices are resistive will be applied to the switch transistor 21.

The transistor 22 serving as the leakage path and having the gate and drain thereof connected to each other is used to regulate the voltage at the node Va until the bias voltage Vcn is stabilized in a standby state or at the time of turning ON the power supply. The leakage path transistor 22 has the ability to determine the high-level voltage of the output signal OUT when the switch transistor 21 is set to an off state.

Figure 5:
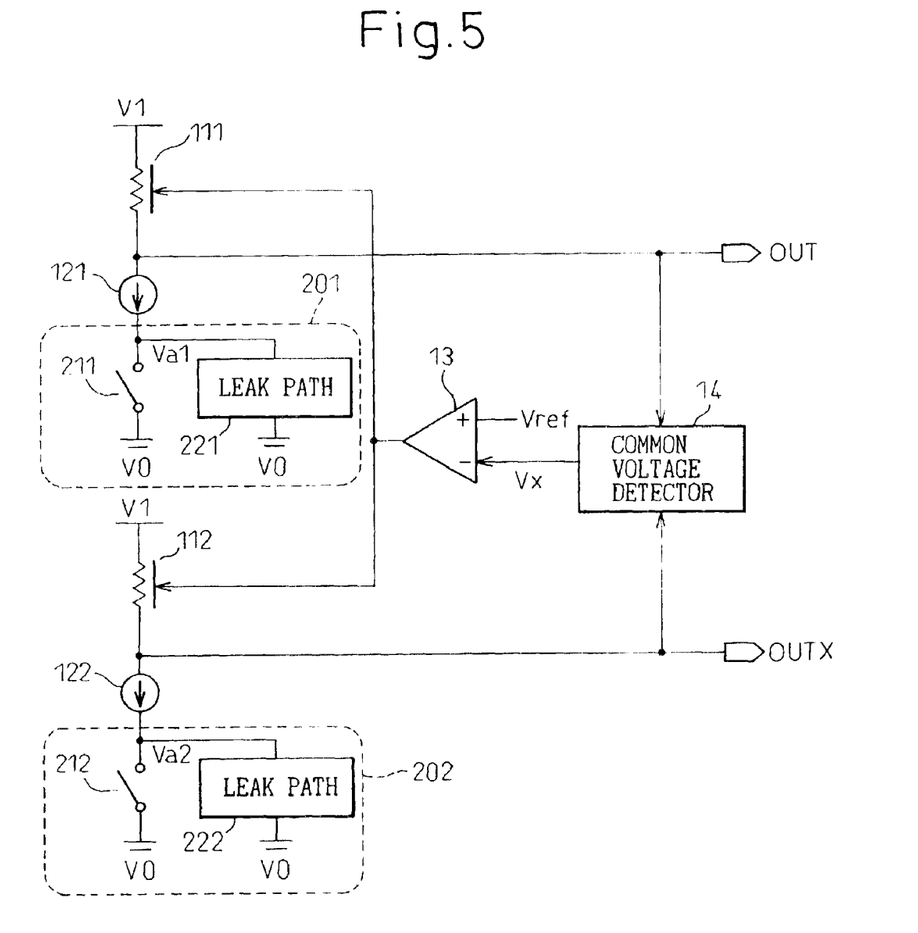
FIG. 5 is a circuit diagram showing a third embodiment of an output circuit according to the present invention.

FIG. 5 is a circuit diagram showing a third embodiment of an output circuit according to the present invention. The first embodiment shown in FIG. 2 is a single-ended type output circuit, while the third embodiment is a differential type output circuit. Referring to FIG. 5, units 201 and 202 are high-speed low-voltage resistive units, and the other components constitute a low-speed high-voltage resistive unit. Specifically, switches 211 and 212 and leakage paths 221 and 222 are realized with transistors whose gate oxides are thin and which resist only a low voltage but can operate at a high speed. In contrast, variable resistors 111 and 112, current sources 121 and 122, a comparator 13, and a common-mode voltage detector 14 are realized with transistors whose gate oxides are thick and which operate at a low speed but which can resist a high voltage.

In the output circuit of the third embodiment, the switches 211 and 212 are alternately turned ON or OFF. Opposite signals are developed as differential output signals (OUT and OUTX). The common-mode voltage detector 14 detects the common-mode voltage of the differential output signals OUT and OUTX. The detected common-mode voltage Vx is transferred to the comparator 13. The comparator 13 compares the common-mode voltage applied to a negative input terminal thereof with the reference voltage Vref applied to a positive input terminal thereof. Based on the result of the comparison, the resistances to be offered by the variable resistors 111 and 112 are adjusted. If the resistances of the variable resistors 111 and 112 are increased based on the reference voltage Vref, the common-mode voltage of the output signals is lowered. In contrast, if the resistances of the variable resistors 111 and 112 are decreased, the common-mode voltage is raised. Furthermore, if a current flowing into the leakage paths 221 and 222 is increased, the amplitude of the output signals gets larger. If the current flowing into the leakage paths 221 and 222 is decreased, the amplitude thereof gets smaller.

As mentioned above, a circuit for determining the amplitude of output signals and a common-mode voltage thereof is constituted by devices that operate at a low speed but can resist a high voltage. Consequently, the output signals OUT and OUTX varying within a wide range of voltages can be transmitted. Incidentally, the current sources 121 and 122 are inserted as stages preceding the switches 211 and 212, which operate at a high speed, for fear that a high voltage may be applied directly to the nodes Va1 and Va2.

Figure 6:
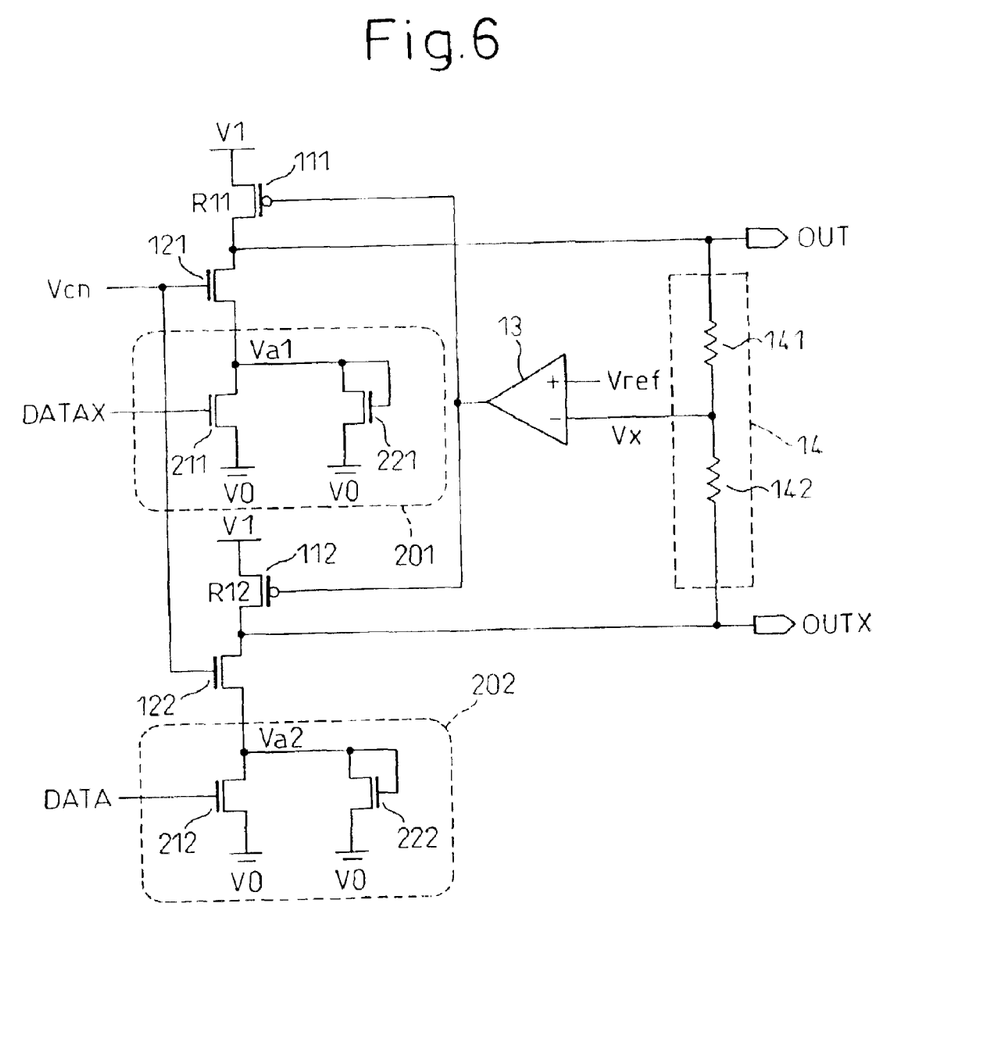
FIG. 6 is a circuit diagram showing a fourth embodiment of an output circuit according to the present invention.

FIG. 6 is a circuit diagram showing a fourth embodiment of an output circuit according to the present invention.

As is apparent from comparison of FIG. 6 with FIG. 5, the output circuit of the fourth embodiment has the same components as the output circuit of the third embodiment does. However, the variable resistors 111 and 112 are realized with PMOS transistors, and the current sources 121 and 122, switches 211 and 212, and leakage paths 221 and 222 are realized with NMOS transistors. Herein, a bias voltage Vcn is applied to the gates of the transistors 121 and 122 serving as the current sources. An input signal DATAX (signal of opposite logical state) is applied to the gate of the transistor 211 serving as the switch. An input signal DATA (signal of positive logical state) is applied to the gate of the transistor 212 serving as the switch. Furthermore, the common-mode voltage detector 14 has resistors 141 and 142. An output (Vx) is developed at a node connecting the resistors.

Figure 7:
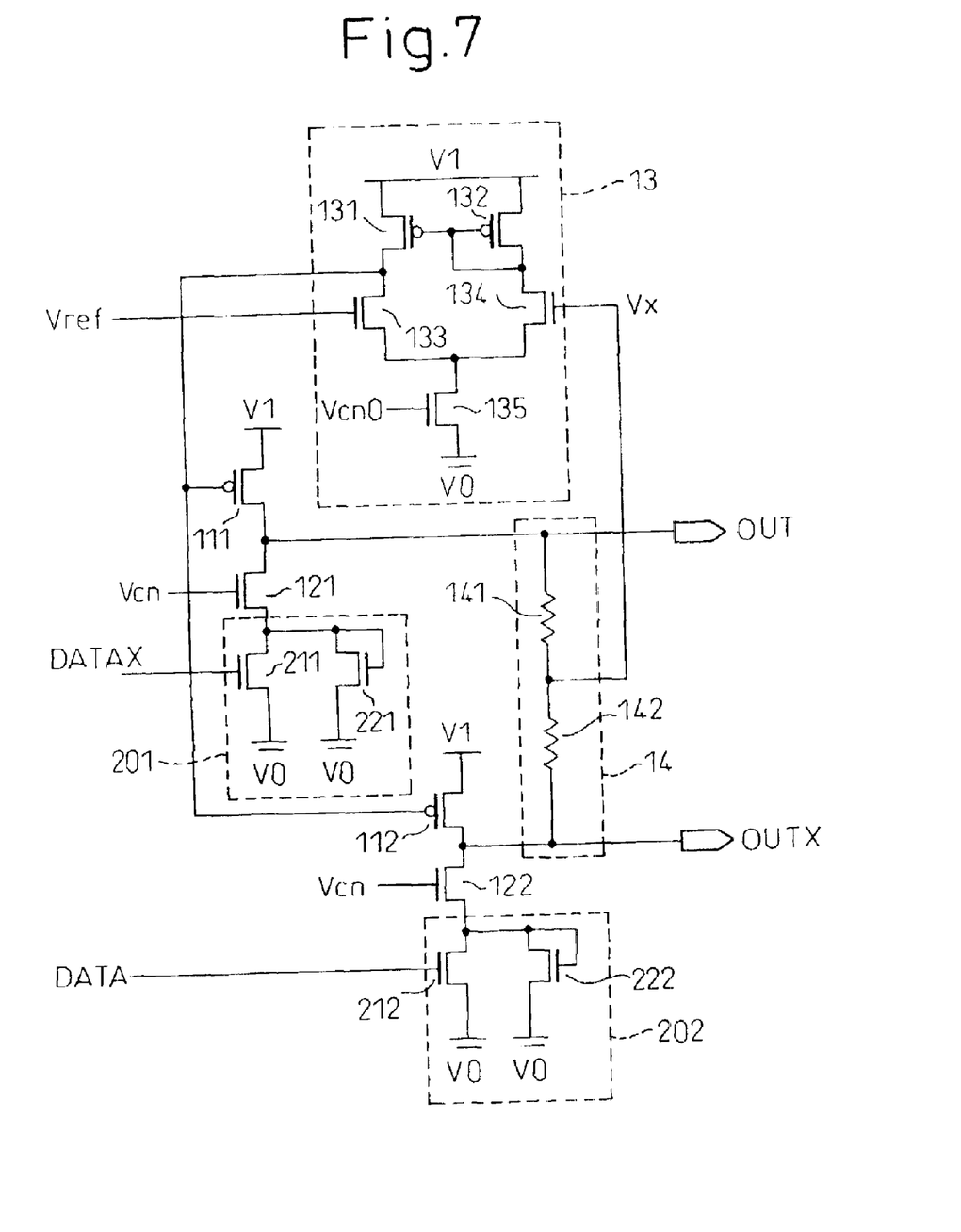
FIG. 7 is a circuit diagram showing a fifth embodiment of an output circuit according to the present invention.

FIG. 7 is a circuit diagram showing a fifth embodiment of an output circuit according to the present invention.

As is apparent from comparison of FIG. 7 with FIG. 6, the output circuit of the fifth embodiment has substantially the same components as the output circuit of the fourth embodiment does. The comparator 13 is designed as a typical differential amplifier and has PMOS transistors 131 and 132 serving as loads, NMOS transistors 133 and 134 serving as differential comparators, and an NMOS transistor 135 serving as a current source. The reference voltage Vref is applied to the gate of the differential comparator transistor 133, and a common-mode voltage Vx detected by the common-mode voltage detector 14 is applied to the gate of the other differential comparator transistor 134. An output developed at a node connecting the transistors 131 and 133 included in the comparator 13 is applied to the gates of the PMONS transistors 111 and 112 serving as variable resistors, whereby the resistances to be offered by the variable resistors are controlled.

Herein, even in the output circuit of the fifth embodiment, the switches (NMOS transistors) 211 and 212 and the leakage paths (NMOS transistors) 221 and 222 (high-speed low-voltage resistive units 201 and 202) are realized with transistors whose gate oxides are thin and which resist only a low voltage but can operate at a high speed. The other components, that is, the variable resistors (PMOS transistors) 111 and 112, the current sources (NMOS transistors) 121 and 122, and the comparator 13 (having PMOS transistors 131 and 132 and NMOS transistors 133 to 135) are realized with transistors whose gate oxides are thick and which operate only at a low speed but can resist a high voltage. The common-mode voltage detector 14 has the resistors 141 and 142. If the resistors are realized with transistors, transistors whose gate oxides are thick and which operate only at a low speed but can resist a high voltage will be employed.

As mentioned above, an output circuit according to the present invention can be adapted to both a single-ended type output circuit and a differential type output circuit. Further, the conduction types (p-channel or n-channel) of transistors may be varied depending on the polarity or the like of a power supply voltage employed. Furthermore, devices constituting an output circuit are not limited to the aforesaid MOS transistors. A comparator and a common-mode voltage detector are available in various types.

As mentioned above, according to the present invention, the amplitude of an output signal and the common-mode voltage thereof can be adjusted arbitrarily. Consequently, there is provided an output circuit capable of transmitting a signal that will reach a receiver circuit with an optimal amplitude and an optimal common-mode voltage. Furthermore, according to the present invention, a signal of a small amplitude can be transmitted in order to prevent a loss of a high-frequency component or reflection of a signal. Consequently, an output circuit requiring a low power consumption can be provided.

Many different embodiments of the present invention may be constructed without departing from the spirit and scope of the present invention. It should be understood that the present invention is not limited to the specific embodiments described in this specification but is defined in the appended claims.

What is claimed is:

1. An output circuit comprising:
   a data control circuit, which resists a low voltage, controlling data included in an output signal according to an input signal;
   a variable resistance circuit connected in series with said data control circuit between a first power supply line and a second power supply line;
   a common-mode voltage detection circuit detecting a common-mode voltage of the output signal;
   an adjusting circuit, which resists a high voltage, adjusting a resistance of said variable resistance circuit according to an output of said common-mode voltage detection circuit, wherein:
   the common-mode voltage of the output signal is adjusted to equal an optional voltage, and an amplitude of the output signal is adjustable.

2. The output circuit as claimed in claim 1, wherein said adjusting circuit operates at a low speed, and said data control circuit operates at a high speed.

3. The output circuit as claimed in claim 2, wherein said variable resistance circuit comprises said second devices.

4. The output circuit as claimed in claim 2, wherein said common-mode voltage detection circuit comprises said second devices.

5. The output circuit as claimed in claim 2, wherein said data control circuit comprises a switching device, a control electrode of said switching device receiving the input signal, and said switching device enabling a high speed operation with a low resistive voltage.

6. The output circuit as claimed in claim 5, wherein said data control circuit comprises a diode-connected transistor for a leakage path, and said diode-connected transistor enabling a high speed operation with a low resistive voltage.

7. The output circuit as claimed in claim 1, further comprising a current source connected between said variable resistance circuit and said data control circuit.

8. The output circuit as claimed in claim 7, wherein said current source is a transistor having a control electrode applied with a bias voltage.

9. The output circuit as claimed in claim 1, wherein said adjusting circuit is a differential amplifier differentially amplifying a reference voltage and an output of said common-mode voltage detection circuit.

10. The output circuit as claimed in claim 1, wherein said first power supply line is a high-potential power supply line, and said second power supply line is a low-potential power supply line.

11. The output circuit as claimed in claim 10, wherein said variable resistance circuit is a p-channel type MOS transistor, and an output of said adjusting circuit is applied to a gate of said p-channel type MOS transistor.

12. The output circuit as claimed in claim 10, wherein said data control circuit comprises a first n-channel type MOS transistor for a switch having a gate receiving the input signal, and a diode-connected second n-channel type MOS transistor for a leakage path.

13. The output circuit as claimed in claim 1, wherein said input signal and said output signal are single-ended signals, and said output circuit is a single-ended type output circuit.

14. The output circuit as claimed in claim 1, wherein said input signal and said output signal are differential signals, and said output circuit is a differential type output circuit.

15. The output circuit as claimed in claim 14, wherein said common-mode voltage detection circuit and said adjusting circuit are provided in common to the differential signals, and the other components are included in one-to-one association with the differential signals.

16. The output circuit as claimed in claim 15, wherein said common-mode voltage detection circuit comprises first and second resistors that are connected in series with each other and that receive the differential output signals, and the common-mode voltage of the output signals is detected through the resistance division of said first and second resistors.

17. An output circuit comprising:
   a data control circuit, which operates at a high speed, controlling data included in an output signal according to an input signal;
   a variable resistance circuit connected in series with said data control circuit between a first power supply line and a second power supply line;
   a common-mode voltage detection circuit detecting a common-mode voltage of the output signal;
   an adjusting circuit, which operates at a low speed, adjusting a resistance of said variable resistance circuit according to an output of said common-mode voltage detection circuit, wherein:
   the common-mode voltage of the output signal is adjusted to equal an optional voltage, and an amplitude of the output signal is adjustable.

18. An output circuit comprising:
   a data control circuit controlling data included in an output signal according to an input signal;
   a variable resistance circuit connected in series with said data control circuit between a first power supply line and a second power supply line;
   a current source connected between said variable resistance circuit and said data control circuit;
   a common-mode voltage detection circuit detecting a common-mode voltage of the output signal;
   an adjusting circuit adjusting a resistance of said variable resistance circuit according to an output of said common-mode voltage detection circuit, wherein:
   the common-mode voltage of the output signal is adjusted to equal an optional voltage, and an amplitude of the output signal is adjustable.

19. The output circuit as claimed in claim 18, wherein said current source is a transistor having a control electrode applied with a bias voltage.

* * * * *